United States Patent Office 3,505,134
Patented Apr. 7, 1970

3,505,134

METALIZING COMPOSITIONS WHOSE FIRED-ON COATINGS CAN BE SUBJECTED TO ACID BATH TREATMENT AND THE METHOD OF USING SUCH METALIZING COMPOSITIONS

Oliver A. Short, Wilmington, Del., assignor to E. I. du Pont de Nemours and Company, Wilmington, Del., a corporation of Delaware

No Drawing. Continuation-in-part of application Ser. No. 542,191, Apr. 13, 1966. This application Mar. 13, 1968, Ser. No. 712,607

Int. Cl. B44c *1/22;* C23b *3/00;* C23g *1/02*

U.S. Cl. 156—2 6 Claims

ABSTRACT OF THE DISCLOSURE

The disclosed invention consists of a novel composition comprising a noble metal powder of gold or gold and platinum and an inorganic binder of PbO, $SiO_2$ and $Al_2O_3$. Amounts up to 10% of $TiO_2$ may be added to increase the acid resistance of the composition. The $Al_2O_3$ is added to insure satisfactory melting. The composition is used to form solder pads on ceramic substrates. A thin film resistor is deposited over the deposited composition and is etched to remove the resistor material and the binder of the surface portion of the composition and thus expose a solderable quantity of noble metal.

Cross-reference to related applications

This is a continuation-in-part of U.S. patent application Ser. No. 542,191, now abandoned, filed Apr. 13, 1966.

Background of the invention

Recently, tantalum nitride resistors, nickel-chromium resistors and tin oxide resistors have found acceptance by the electronic industry. These resistors are usually prepared by evaporating the resistor material onto the entire surface of a suitable substrate, and thereafter photo-etching away the undesired portion of the resistor deposit in a strong acid bath. When employing tantalum nitride, for example, a nitric acid-hydrofluoric acid bath is preferably used to etch away the undesired deposit and to leave behind on the substrate, resistors in the positions and of the shapes desired.

It is most convenient in forming circuits and subcircuits, incorporating the above resistor materials, to form conductive paths and solder pads on the substrate prior to the application and etching of the resistor material. However, the metalizing compositions available heretofore to form such conductive paths and solder pads tend to disintegrate when subjected to the acid-etching procedure.

The present invention provides metalizing compositions that can be fired onto substrates prior to the application of the resistor material, and thereafter subjected to the above-mentioned acid bath treatment together with the resistor material without being disintegrated.

Summary of the invention

According to the present invention there is provided a metalizing composition characterized by comprising from 75 to 98% by weight noble metal powder and 25 to 2% by weight inorganic binder, said noble metal powder consisting of 50 to 100% by weight gold and 0 to 50% by weight platinum, said inorganic binder comprising a glass consisting essentially of 55 to 65% by weight PbO, 25 to 35% by weight $SiO_2$, 0.5 to 5% by weight $Al_2O_3$ and 0 to 10% by weight $TiO_2$. Preferably the noble metal powder constitutes from 80 to 86% by weight of the metalizing composition and the inorganic binder constitutes the remaining 20 to 14% by weight. Most preferred is the composition of 82% by weight noble metal powder and 18% by weight inorganic binder.

The noble metal powder may be either gold or a mixture of gold and platinum, wherein the gold constitutes 50% or more of the total amount of gold and platinum. Where the metalizing composition is to be used to form a conductive path, preferably the noble metal is substantially pure gold in order to obtain a very high conductivity. Fired-on coatings produced from the metalizing compositions of this invention which have as the meal component 100% gold exhibit resistivities of about 10 milliohms per square per one mil of thickness. Mixtures of gold and platinum, wherein the platinum constitutes less than about 3% by weight of the metal present when used as the metal component of the metalizing compositions of this invention, produce fired-on coatings having resistivities in the range of 10 to 20 milliohms per square per one mil of thickness. It will be noted that irrespective of which noble metal composition is used (i.e., 50–100% gold and 0–50% platinum), the resulting metalizing composition possesses good conductive properties.

Metalizing compositions of this invention which contain as the metal component a mixture of gold and platinum within the preferred range can, after being exposed to the nitric acid-hydrofluoric acid bath, be dip soldered. The preferred range of these mixtures includes those mixtures which contain from 83 to 87% by weight gold, and from 17 to 13% by weight platinum. The most preferred mixture contains 85% by weight gold and 15% by weight platinum. The term "mixture" as used herein, is meant to encompass alloys as well as ordinary mixtures of gold particles and platinum particles. Of these two types of mixtures the mixtures of separate particles of gold and platinum are preferred. One example of a suitable solder bath for use with these metalizing compositions is a bath consisting of 60% by weight tin and 40% by weight lead, having a melting temperature of 210° C.

The metalizing compositions of this invention are generally applied to substrates with the aid of stencilling screens, and when so used the noble metal components thereof, as well as the inorganic binders, are sufficiently finely divided to pass through the screens with which they are used. Stencilling screens of 100, 160, 200 and 325 mesh (U.S. Standard Sieve Scale) can be used. Generally, the metal powder will have an average particle size not exceeding 40 microns with no more than 5% of the particles being larger than 42 microns. Desirably, the average particle size will not exceed about 5 microns, and preferably will be in the range of 0.1 to 1.0 micron. The most preferred powder will be essentially free of particles of a size greater than 5 microns with an average particle size in the range of 0.1 to 1.0 micron.

The inorganic binder component of the present invention is composed principally of glass which generally contains between 55 to 65% by weight PbO, 25 to 35% by weight $SiO_2$, 0.5 to 5% by weight $Al_2O_3$ and 0 to 10% by weight $TiO_2$. Preferably, at least 1% by weight $TiO_2$ is present in the glass. Metalizing compositions prepared from inorganic binders having higher amounts of PbO, or lower amounts of $SiO_2$, have insufficient acid resistance for use in this invention. Inorganic binders having lower amounts of PbO, or higher amounts of $SiO_2$ are very difficult to prepare because it is very difficult to melt such proportions of PbO and $SiO_2$. Even with the stated proportions of PbO and $SiO_2$ it is essential to add 0.5 to 5% $Al_2O_3$ in order to obtain satisfactory melting. The $TiO_2$ is preferably added to enhance the acid resistance of the composition. The preferred glass formulations used in this invention contain 59 to 62% by weight PbO, 31 to 33% by weight $SiO_2$, 0 to 3% by weight $Al_2O_3$ and 1 to 9% by weight $TiO_2$. The most preferred glass contains 60% by weight PbO, 32% by weight $SiO_2$, 1% by weight $Al_2O_3$ and 7% by weight $TiO_2$ Other metal oxides such as CaO, BaO, CuO, ZnO and $ZrO_2$, but excluding poorly acid resistant material such as $P_2O_5$, $As_2O_3$ and $B_2O_3$, can be incorporated into the glass in minor amounts of up to 10% by weight based on the amount of glass present.

The glasses which form part of the metalizing compositions of this invention are usually prepared by mixing together all of the constituents thereof, melting the same at about 2800° C. until the equilibrium is reached and then fritting the same by pouring the melts into water. A frit thus formed is then ball-milled for 16 hours in a porcelain jar mill with porcelain balls and a quantity of water equal in weight to about ⅓ the weight of the glass. The glass is then filtered to yield fine particles having a particle size of less than 30 microns, and preferably in the range of from 3 to 10 microns. The glass used in the examples, set forth hereinafter, was prepared in the above manner and had an average particle size within the range of 3 to 10 microns with no particles larger than 42 microns. Glasses prepared in the above manner were employed as the sole component of the inorganic binder in the examples below.

While the preferred inorganic binder consists entirely of the glass described above, metal oxides such as $Bi_2O_3$, PbO and CdO may be used as separate additives in either amounts of up to 10% by weight based on the amount of glass present.

Metalizing compositions comprising the above inorganic binders will usually be fired successfully at temperatures within the range of 800° C. to 1000° C.

The metalizing compositions described above can be deposited onto a ceramic substrate through a suitable perforate masking layer in any circuit design desired, and then fired on the substrate. It is preferred, however, to mix inert liquid organic vehicles with these metalizing compositions. Such mixtures are commonly referred to in the art as "inks." These inks generally contain 2 to 20 parts of metal and inorganic binder, which constitute the inorganic solid components thereof, for every 1 part of vehicle. For screen stencilling purposes, ratios of 3 to 6 parts of metal and inorganic binder for every 1 part of vehicle have been found to have good application properties. Inks having about 4 parts of metal and inorganic binder for every 1 part of vehicle are preferred.

The term "inert liquid organic vehicle" includes any organic liquid which is inert to the other components of the metalizing composition and in which the inorganic binder and metal powder can be dispersed, and applied to a substrate. Examples of such vehicles are methyl, ethyl, butyl, propyl and higher alcohols; the corresponding esters such as the acetates, propionates, etc.; the terpenes such as pine oil, alpha-terpineol and beta-terpineol; and solutions of resins such as the polyterpene resins, the polymethacrylates of the lower alcohols, and ethylcellulose in solvents such as aliphatic petroleum naphtha, terpene and alkyl ethers of ethylene glycol. The vehicle may contain volatile liquids such as kerosene, xylene, toluene and the like to promote fast setting after application. The inert organic vehicle which is preferred consists of an 8% solution of ethylcellulose in beta-terpineol.

The metalizing compositions of this invention are generally usable in preparing fired coatings on the common substrates such as forsterite, sapphire, steatite, titanium dioxide, alkali earth titanates, zircon, porcelain and alumina. In addition, by reason of their excellent wetting properties which lead to high adhesion, the metalizing compositions of this invention can be applied to, and will adhere to fired-on overglaze coating of glass.

In the examples set forth hereinafter, the metal components of the metalizing compositions were prepared as follows: The gold particles were prepared by mixing at room temperature 100 ml. of an aqueous solution of 25% by weight of $AuCl_3$ with 100 ml. of a 10% by weight solution of $FeSO_4$. The resulting gold particles had an average particle size of 1 micron. The platinum particles were prepared by mixing together at room temperature 100 ml. of a 25% by weight aqueous solution of $PtCl_4$ and 100 ml. of a 10% by weight aqueous solution of a reducing agent consisting of 50% by weight $FeSO_4$ and 50% by weight glycerol. The platinum particles which precipitated from this mixture had an average particle size of 0.1 micron.

To demonstrate this invention six metalizing inks were prepared by mixing together the ink components of Table I, which themselves had been prepared as indicated above, and using and testing the inks as indicated in the three following examples.

TABLE I

| Inks | 1 | 2 | 3 | 4 | 5 | 6 |
|---|---|---|---|---|---|---|
| Ink components (weight percent of inorganic solid components): | | | | | | |
| Gold particles (average particle size 1 micron) | 82 | 70 | 82 | 70 | 82 | 70 |
| Platinum particles (average particle size 0.1 micron) | 0 | 12 | 0 | 12 | 0 | 12 |
| Inorganic binder (100% glass) | 18 | 18 | 18 | 18 | 18 | 18 |
| Glass constituents expressed as wt. percent of glass present: | | | | | | |
| PbO | 60 | 60 | 61 | 61 | 65 | 65 |
| $SiO_2$ | 32 | 32 | 32 | 32 | 32 | 32 |
| $TiO_2$ | 7 | 7 | 7 | 7 | 2 | 2 |
| $Al_2O_3$ | 1 | 1 | 0 | 0 | 1 | 1 |

The vehicle used in preparing the inks consisted of 8 parts by weight ethyl cellulose in 92 parts by weight beta-terpineol. One part by weight of this vehicle was used in each of the above inks for every four parts of the inorganic solid components thereof.

EXAMPLE 1

A U-shaped deposit of Ink 1 (to serve as a conductive path) was stencilled through a 165 mesh screen (U.S. Standard Sieve Scale) onto an alumina plate, and was dried at 100° C. for 1 minute. Thereafter, two spaced apart rectangular shaped deposits of Ink 2 (to serve as solder pads) were stencilled through a similar 165 mesh screen in overlapping realtionship with the free ends of the U-shaped deposit. The plate with the three deposits thereon was then fired at 1000° C. for a period of six minutes. The plate was cooled, then reheated to 1000° C. for six minutes, cooled again and heated to 800° C. for six minutes, and finally cooled. These last two heating cycles were employed to simulate the separate firing of overglass crossovers and addition conductive paths. A thin film of tantalum nitride was then evaporated onto the stencilled side of the plate to simulate resistor forming. The plate was immersed for 30 seconds in an acid bath containing 1 part of concentrated $HNO_3$, 1 part of concentrated HF and 2 parts of water. All of tantalum nitride film was removed in the bath at about 12 seconds after the plate was immersed in the acid. Thereafter, tinned copper wires of 0.025 in. diameter were soldered to the solder pads by holding the wires in contact with the solder pads, and dipping the wires and plate into a 210° C. solder bath of 60% by weight tin and 40% by weight lead. Care was exercised to dip only the solder pads and not the conductive path into the solder bath. On testing, the conductive path exhibited a resistivity of 12 milliohms per square per mil of thickness. The solder joints and adhesion of the solder pads and conductive path were excellent. Adhesion was measured on an "Instron" testor at a crosshead speed of ten inches per minute. Adhesive values in excess of 500 p.s.i.g. were observed.

EXAMPLE 2

Employing the indentical procedure and materials as set forth in Example 1, with the exceptions that ink 3 was used instead of Ink 1 and Ink 4 was used instead of Ink 2, a printed circuit, consisting of a single conductor and two solder pads to which were soldered two tinned copper wires, was constructed and tested. The conductive path exhibited a resistivity of 13 milliohms per square per mil of thickness, and adhesive values in excess of 500 p.s.i. were observed.

EXAMPLE 3

Employing the same procedure and materials as set forth in Example 1, with the exceptions that Ink 5 was used instead of Ink 1 and Ink 6 was used instead of Ink 2, and with the further exception that the plate and solder pads were immersed in the solder bath for only 20 seconds, a printed circuit free of tantalum nitride film, which was observed to have been removed at about 12 seconds was formed. The circuit consisted of a single conductor and two solder pads. Two tinned copper wires were soldered to the pads, using the solder bath of Example 1. The conductive path on testing exhibited a resistivity of 11 milliohms per square per mil of thickness. Adhesive values in excess of 500 p.s.i. were observed.

In order to obtain a solder connection to a fired-on coating formed from a metalizing composition of this invention, it is necessary that the thin layer of inorganic binder which covers a large quantity of the metal particles in the surface portion of the fired-on coating be removed. Normally this could be achieved through the use of a strong acid flux, but such flux compositions are not approved for use by the printed electrical circuit industry. In accordance with this invention, the surface portion of the fired-on coating is prepared for solder acceptance during the acid etching operation. The substrate with the fired-on coating and overlying resistor material is immersed in a strong acid bath for a period of time sufficient to remove not only the overlying resistor material, but also the above-mentioned thin layer of inorganic binder. Excessive acid exposure is avoided since this will result in the total disintegration of the inorganic binder holding the metal particles in the surface portion of the fired-on coating, and thus a loss of solderability.

It has been found that fired-on coatings, whose inorganic binder contains 7% by weight $TiO_2$, such as the coatings formed from Inks 2 and 4, must be immersed in strong acid for periods of from 15 to 30 seconds in excess of the period required to remove the overlying resistor material in order to provide a dip solderable surface. Fired-on coatings whose inorganic binder contains 2% by weight $TiO_2$ such as the coating formed from Ink 6, require a strong acid bath immersion period within the range of from 7 to 12 seconds, in excess of the period required to remove the overlying resistor material. Fired-on coatings of this invention which contain no $TiO_2$, require acid immersion periods of from 1 to 2 seconds in excess of the time required to remove the overlying resistor material.

Since the acid bath immersion interval is so short when the $TiO_2$ content of the inorganic binder is less than about 1%, it is recommended that inorganic binders having 1% or more of $TiO_2$ be employed.

What is claimed is:

1. A metalizing composition comprising from 75 to 98% by weight noble metal powder and 25 to 2% by weight inorganic binder, said noble metal powder consisting of 50 to 100% by weight gold and 0 to 50% by weight platinum, said inorganic binder comprising a glass of 55 to 65% by weight PbO, 25 to 35% by weight $SiO_2$, 0.5 to 5% by weight $Al_2O_3$ and 0 to 10% by weight $TiO_2$.

2. The metalizing composition of claim 1 wherein said noble metal powder consists of from 83 to 87% by weight gold particles and from 17 to 13% by weight platinum particles.

3. The metalizing composition of claim 1 wherein said noble metal powder consists of gold particles.

4. The metalizing composition of claim 1 wherein said glass consists of from 59 to 62% by weight PbO, 31 to 35% by weight $SiO_2$, 0.5 to 3% by weight $Al_2O_3$, and 1 to 9% by weight $TiO_2$.

5. The metalizing composition of claim 4 wherein said noble metal powder consists essentially of a mixture of from 83 to 87% by weight gold and 17 to 13% by weight platinum.

6. The method of forming solder pads on ceramic substrates which comprises depositing in a pattern a metalizing composition consisting essentially of from 75 to 98% by weight of a solderable noble metal powder and 25 to 2% by weight inorganic binder onto a ceramic substrate, said noble metal powder consisting of 50 to 100% by weight gold and 0–50% by weight platinum, said binder consisting essentially of 55 to 65% by weight PbO, 25 to 35% by weight $SiO_2$, 0.5 to 5% by weight $Al_2O_3$ and 1 to 10% by weight $TiO_2$, firing said metalizing composition to form a fired-on coating depositing a layer of acid etchable thin film resistor material over said fired-on coating, thereafter immersing said substrate in an acid bath for a period of time sufficient to selectively remove the resistor material overlying said fired-on coating, and for an additional period of time sufficient to remove the inorganic binder from the surface portion of the fired-on coating to expose a solderable quantity of the noble metal, but insufficient to free a substantial quantity of the noble metal from the fired-on coating.

References Cited

UNITED STATES PATENTS

| | | | |
|---|---|---|---|
| 3,317,653 | 5/1967 | Layer et al. | 117—212 X |
| 3,291,578 | 12/1966 | Fahey | 117—8 |
| 3,277,020 | 10/1966 | Rao | 252—514 |
| 3,252,831 | 5/1966 | Ragan | 252—514 X |
| 2,693,023 | 11/1954 | Kerridge et al. | 117—212 |
| 3,345,210 | 10/1967 | Wilson | 117—217 X |

OTHER REFERENCES

Sailer, Garce, Miller & Aycock, "Microelectric Conductive Compositions," IBM Technical Bulletin, vol. 7, No. 12, April 1965.

ALFRED L. LEAVITT, Primary Examiner

A. GRINALDI, Assistant Examiner

U.S. Cl. X.R.

117—212; 156—8; 252—514, 520